United States Patent

Morimoto

(10) Patent No.: US 8,144,471 B2
(45) Date of Patent: Mar. 27, 2012

(54) CABLE ROUTING STRUCTURE

(75) Inventor: Mitsuru Morimoto, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 687 days.

(21) Appl. No.: 12/275,265

(22) Filed: Nov. 21, 2008

(65) Prior Publication Data

US 2009/0147487 A1    Jun. 11, 2009

(30) Foreign Application Priority Data

Dec. 10, 2007   (JP) .................. 2007-318020

(51) Int. Cl.
*H05K 1/00*   (2006.01)

(52) U.S. Cl. ...................... 361/749; 174/255

(58) Field of Classification Search .............. 361/685, 361/686, 749, 760; 174/255, 378; 439/445, 439/422, 108
See application file for complete search history.

(56) References Cited

U.S. PATENT DOCUMENTS

| | | | |
|---|---|---|---|
| 7,234,149 B2 * | 6/2007 | Takahashi et al. | 720/601 |
| 7,416,435 B2 * | 8/2008 | Onogi | 439/445 |
| 2005/0289575 A1 * | 12/2005 | Makara et al. | 720/652 |

FOREIGN PATENT DOCUMENTS

| | | | |
|---|---|---|---|
| EP | 1067550 A1 * | 1/2001 | |
| JP | 06-243601 A | 9/1994 | |
| JP | 2003-309381 A | 10/2003 | |
| JP | 2006-31910 A | 2/2006 | |

* cited by examiner

*Primary Examiner* — Yuriy Semenenko
(74) *Attorney, Agent, or Firm* — Global IP Counselors

(57) ABSTRACT

A cable routing structure includes a flexible flat cable and a wiring board. The wiring board has a first side and a second side that is opposite the first side. The wiring board includes a cable attachment component, a first access component and a second access component. The cable attachment component is formed on the first side of a wiring board and electrically coupled to an end portion of the flexible flat cable. The first access component includes a first slit formed on the wiring board. The flexible flat cable extends through the first slit from the first side of the wiring board to a second side of the wiring board. The second access component is spaced from the first access component. The flexible flat cable extends through the second access component from the second side of the wiring board to the first side of the wiring board.

20 Claims, 3 Drawing Sheets

CABLE ROUTING STRUCTURE

CROSS-REFERENCE TO RELATED APPLICATIONS

This application claims priority to Japanese Patent Application No. 2007-318020 filed on Dec. 10, 2007. The entire disclosure of Japanese Patent Application No. 2007-318020 is hereby incorporated herein by reference.

BACKGROUND OF THE INVENTION

1. Field of the Invention

The present invention generally relates to a cable routing structure. More specifically, the present invention relates to a cable routing structure for securing a flexible flat cable to a wiring board.

2. Background Information

With a conventional electronic device, a control-use wiring board is usually attached to a rear face of a front panel of the electric device. The control-use wiring board is connected to a main board by a flexible flat cable. In most cases, a cable end of the flexible flat cable on the control-use wiring board side is soldered to a surface of the control-use wiring board. To prevent solder separation at the cable end, the flexible flat cable is fixed at a location near the cable end by double-sided adhesive tape to the surface of the control-use wiring board, so that the soldered cable end will not be subjected to tensile force or bending stress.

A conventional cable routing structure for a bendable wiring board (e.g., flexible flat cable) includes a bendable wiring board, a base and a moving body. The bendable wiring board is formed in a form of a strip. The base has a first fixing component that fixes one end of the bendable wiring board. The moving body has a second fixing component that is disposed movably with respect to the base and fixes the other end of the bendable wiring board. The bendable wiring board has a first bent component, a second bent component and a middle component. The first bent component is bent so that front and back faces are substantially inverted. The second bent component is bent in the opposite direction from the first bent component. The middle component is located in between the second bent component and the first bent component. A part of the middle component is supported in a fixed manner by a support component. An area near the part is pressed on by first and second pressing components. The middle component is deformed into a peaked shape in side view (see Japanese Laid-Open Patent Application Publication No. 2003-309381, for example).

Another conventional cable routing structure for a flexible flat cable, the flexible flat cable is provided with a slack component for absorbing movement distance of a pickup of a disk device. The slack component is provided with two bent parts where bending goes back in a reverse direction. An L-shaped latching piece is latched to one of the bent parts, so that a connected end is not affected by sliding of the pickup and load produced by the movement of the flexible flat cable near the connected end (see Japanese Laid-Open Patent Application Publication No. 2006-31910, for example).

It is also known that a pickup main body and a circuit board are connected with a flexible wiring board in which a middle part is bent in a free state, and expansion of a bent portion of the flexible wiring board is suppressed by a pressing tab provided to the pickup main body (see Japanese Laid-Open Patent Application Publication No. H6-243601, for example).

However, when a location near the soldered end of the flexible flat cable is affixed to the surface of the control-use wiring board with double-sided adhesive tape, the affixing step and the expense of the parts, such as the expense of the double-sided adhesive tape, drive up the cost. Furthermore, when a vibration test or drop test is performed, the double-sided adhesive tape separates, which exerts a force on the soldered end of the flexible flat cable. Thus, solder separation occurs at the cable end.

Also, a housing of an electronic device is assembled by fitting upper and lower covers to the front panel to which the control-use wiring board is attached. When the covers are fitted, the flexible flat cable is pinched by the covers.

With the flexible flat cable routing structure in Japanese Laid-Open Patent Application Publication No. 2003-309381, moving parts is moved smoothly. However, when the connected end of the cable is soldered, the solder separation will occur. Again with the cable routing structures in Japanese Laid-Open Patent Application Publication Nos. 2006-31910 and H6-243601, since a location near the connected end of the cable is not fixed, the solder separation will occur when the cable connection portion is soldered.

Also, none of Japanese Laid-Open Patent Application Nos. 2003-309381, 2006-31910 and H6-243601 is equipped with a means for preventing damage to the flexible flat cable by pinching during fitting of the cover to the front panel, so applying the technology in these patent documents does not prevent damage to the flexible flat cable by pinching.

In view of the above, it will be apparent to those skilled in the art from this disclosure that there exists a need for an improved cable routing structure. This invention addresses this need in the art as well as other needs, which will become apparent to those skilled in the art from this disclosure.

SUMMARY OF THE INVENTION

The present invention is conceived in light of the above-mentioned problems. One object of the present invention is to provide a cable routing structure with which a flexible flat cable is appropriately secured to a wiring board.

In accordance with one aspect of the present invention, a cable routing structure basically comprises a flexible flat cable and a wiring board. The wiring board has a first side and a second side that is opposite the first side. The wiring board includes a cable attachment component, a first access component and a second access component. The cable attachment component is formed on the first side of a wiring board and electrically coupled to an end portion of the flexible flat cable. The first access component includes a first slit formed on the wiring board. The flexible flat cable extends through the first slit from the first side of the wiring board to a second side of the wiring board. The second access component is disposed at a location spaced from the first access component. The flexible flat cable extends through the second access component from the second side of the wiring board to the first side of the wiring board.

With this cable routing structure, it is possible to provide a cable routing structure with which a flexible flat cable is appropriately secured to a wiring board.

These and other objects, features, aspects and advantages of the present invention will become apparent to those skilled in the art from the following detailed descriptions, which, taken in conjunction with the annexed drawings, discloses preferred embodiments.

BRIEF DESCRIPTION OF THE DRAWINGS

Referring now to the attached drawings which form a part of this original disclosure.

DETAILED DESCRIPTION OF THE PREFERRED EMBODIMENT

Selected embodiments of the present invention will now be explained with reference to the drawings. It will be apparent to those skilled in the art from these disclosures that the following descriptions of the selected embodiments of the present invention are provided for illustration only and not for the purpose of limiting the invention as defined by the appended claims and their equivalents.

First Embodiment

Figure 1:
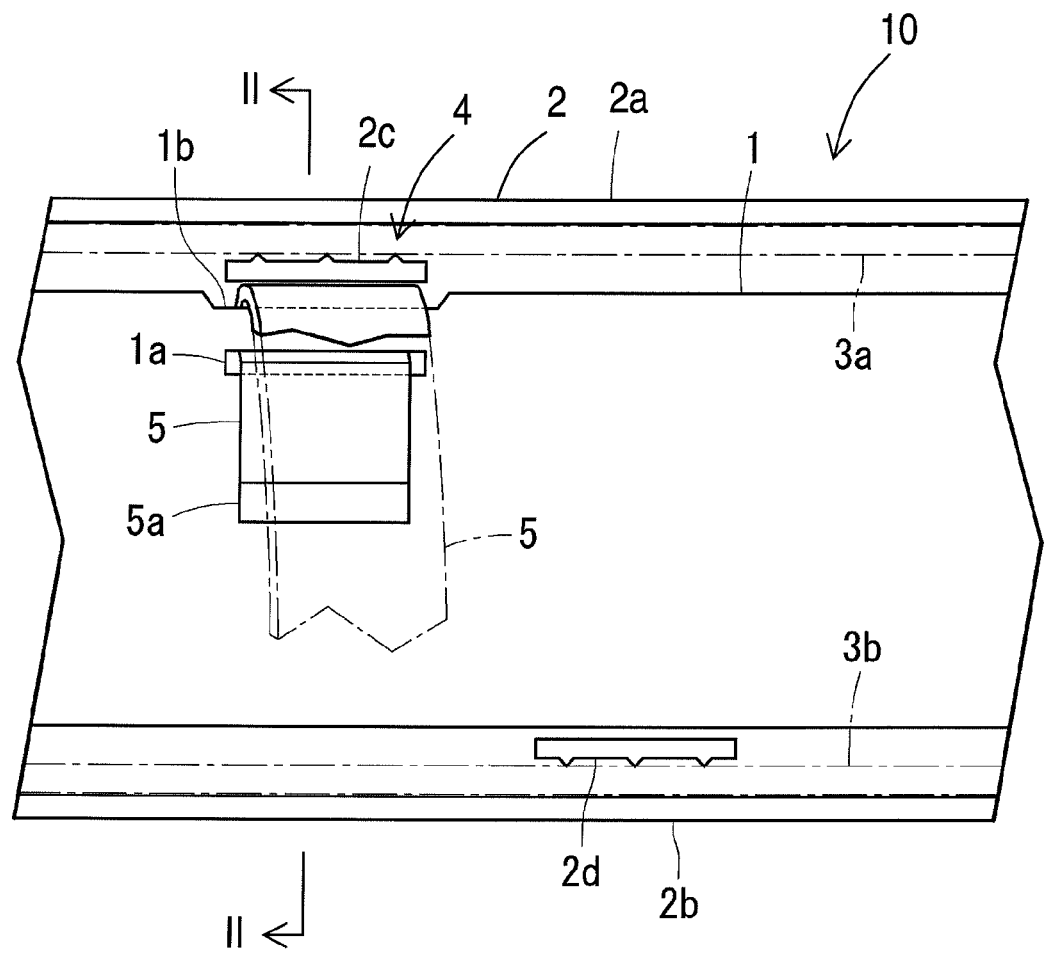
FIG. 1 is a partial front view of a cable routing structure for a flexible flat cable in accordance with a first embodiment.
Figure 2:
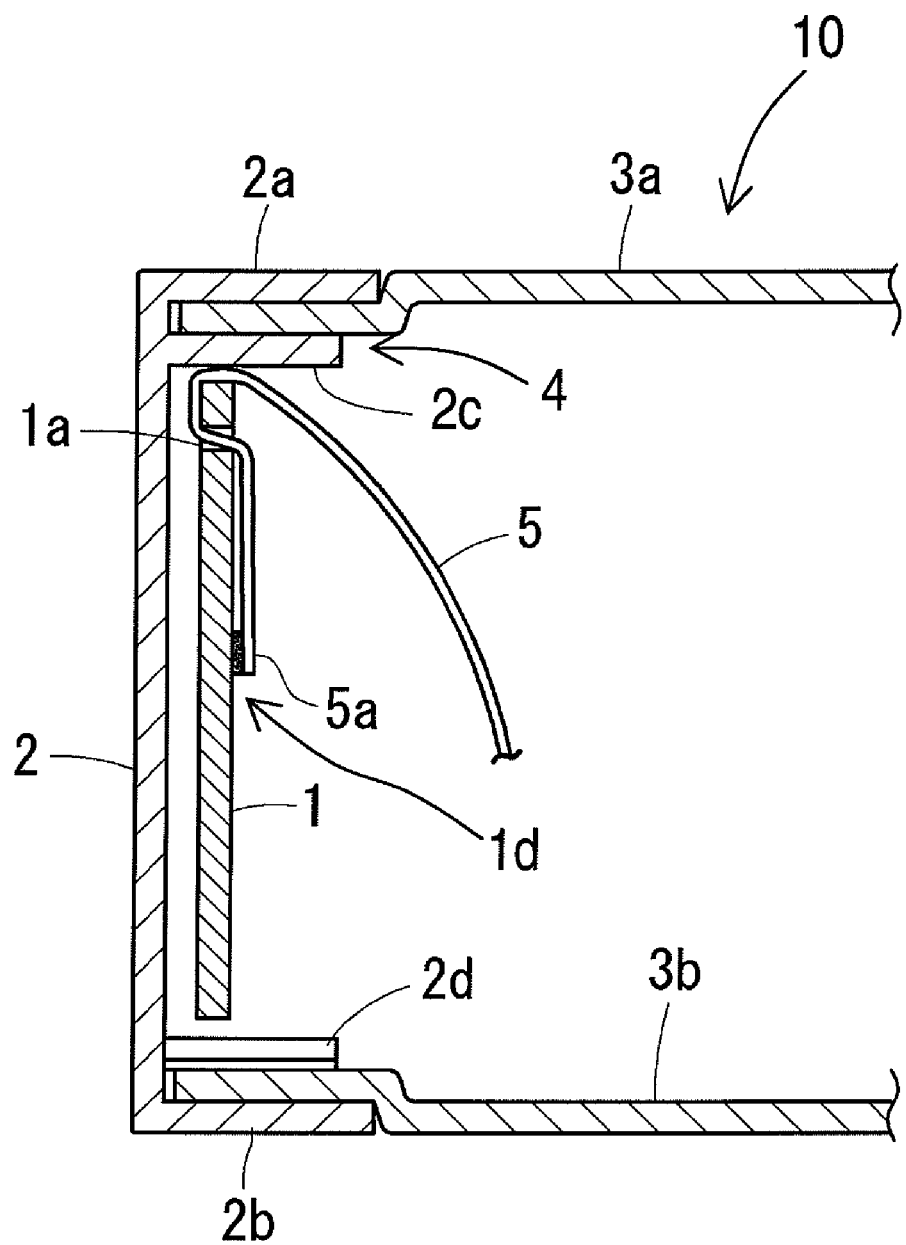
FIG. 2 is a partial cross sectional view of the cable routing structure taken along II-II line in FIG. 1.

FIG. 1 is a partial front view of a cable routing structure for a flexible flat cable 5. FIG. 2 is a partial cross sectional view of the cable routing structure.

As shown in FIGS. 1 and 2, an electronic device 10 includes a wiring board 1 for controlling the electronic device 10. The electronic device 10 is an electronic device, such as a DVD recorder or a DVD player. The electronic device 10 has a housing including a front panel 2 and top and bottom covers 3a and 3b. The housing defines an inside of the electronic device 10. The wiring board 1 is attached to a rear face (e.g., inside face) of the front panel 2 of the electronic device 10. The front panel 2 includes a top frame edge portion 2a, bottom frame edge portion 2b, an upper cover guide rib 2c and a lower cover guide rib 2d. The top and bottom frame edge portions 2a and 2b protrudes rearward from the rear face of the front panel 2. The upper and lower cover guide rib 2c and 2d protrudes rearward from the rear face of the front panel 2. The upper and lower cover guide rib 2c and 2d are formed on the front panel 2 at locations between the top and bottom frame edge portions 2a and 2b.

As shown in FIG. 2, the top and bottom covers 3a and 3b are fitted to the front panel 2 to assemble the housing. The top cover 3a is positioned by having a distal end of the top cover 3a inserted between the top frame edge portion 2a and the upper cover guide rib 2c on the inside of the top frame edge portion 2a. The bottom cover 3b is positioned by having a distal end of the bottom cover 3b inserted between the bottom frame edge portion 2b and the lower cover guide rib 2d on the inside of the bottom frame edge portion 2b. The upper and lower cover guide ribs 2c and 2d are in a form of protruding tabs, which protrude from the rear face of the front panel 2 so as to be parallel with the top frame edge portion 2a and the bottom frame edge portion 2b. The upper cover guide rib 2c on the upper side also serves as a cable guide rib 4.

The flexible flat cable 5 is disposed in a longitudinal direction from an upper portion to a lower portion of the wiring board 1. The flexible flat cable 5 is disposed on a surface of the wiring board 1. Specifically, one cable end (e.g., end portion) 5a of the flexible flat cable 5 is soldered to a rear face of the wiring board 1. More specifically, the cable end 5a of the flexible flat cable 5 is electrically coupled to a cable attachment component 1d formed on the rear face of the wiring board 1. The other end of the flexible flat cable 5 is connected to a main wiring board (not shown) installed inside of the electronic device 10. The wiring board 1 includes a slit (e.g., first access component) 1a that extends in a lateral direction of the wiring board 1. Specifically, the wiring board 1 includes a base plate with the slit 1a. The base plate is formed as a one-piece, unitary member. The slit 1a includes a closed hole having a continuous circumference. The slit 1a has a width that is a little longer than a width of the flexible flat cable 5. The slit 1a is formed near an upper end of the wiring board 1.

The flexible flat cable 5 is guided through the slit 1a from a rear side of the wiring board 1 to a front side of the wiring board 1, and extends along an upper end face (e.g., side edge portion) of the wiring board 1 and back from the front side to the rear side. When the flexible flat cable 5 is routed in this manner, the flexible flat cable 5 is bent and caught by an edge of the slit 1a and the upper end face of the wiring board 1. Therefore, the flexible flat cable 5 is securely fixed to the wiring board 1. As a result, even if the flexible flat cable 5 is subjected to vibration or impact, the soldered cable end 5a is subjected to almost no tensile force, bending stress, or the like. Thus, solder separation of the cable end 5a can be satisfactorily prevented and the flexible flat cable 5 is appropriately secured to the wiring board 1.

As shown in FIG. 1, the upper cover guide rib 2c on the upper side protrudes rearward from the rear face of the front panel 2 at a location that conforms to a cable routing site on the upper end face of the wiring board 1. The upper cover guide rib 2c also serves as the cable guide rib 4 that prevents the flexible flat cable 5 from being pinched by the top cover 3a when the top cover 3a is being fitted to the front panel 2. The flexible flat cable 5 extends from a gap formed between the upper end face of the wiring board 1 and the dual-purpose cable guide rib 4 (e.g., upper cover guide rib 2c) to the rear side of the wiring board 1. As a result, when the top cover 3a is fitted to the front panel 2, the cable guide rib 4 prevents the flexible flat cable 5 from being pinched by the top cover 3a. Thus, damage to the flexible flat cable 5 is prevented.

The cable guide rib 4 can protrude from the rear face of the front panel 2 separately from (or in addition to) the upper cover guide rib 2c. However, having one component serve as both the upper cover guide rib 2c and the cable guide rib 4 is lower the manufacturing cost of the front panel 2 and the electronic device 10 having the front panel 2.

Thickness of the cable guide rib 4 can be increased a little, so that the cable guide rib 4 (e.g., upper cover guide rib 2c) presses the flexible flat cable 5 against the upper end face of the wiring board 1. With this arrangement, the flexible flat cable 5 can be fixed more securely, so the effect of preventing solder separation of the cable end 5a can be even more pronounced.

The wiring board 1 further includes a shallow recess 1b. The recess 1b is formed at the cable routing site on the upper end face of the wiring board 1. The flexible flat cable 5 extends from a slit-shaped cavity formed between the recess 1b and the cable guide rib 4 to the rear side of the wiring board 1. The advantage to having the recess 1b is that it is easier to dispose the flexible flat cable 5 through the slit-shaped cavity. The recess 1b and the upper cover guide rib 2c forms a second access component spaced from the first access component. The flexible flat cable 5 extends through the second access component from the front side of the wiring board 1 to the rear side of the wiring board 1. Furthermore, the cable attachment component, the first access component and the second access component form the cable routing structure.

With the cable routing structure, a location near the cable end 5a of the flexible flat cable 5 is not fixed to the surface of the wiring board 1 with double-sided adhesive tape. Thus, there is no need for a step of affixing with double-sided adhesive tape as in the past, and the cost can be reduced correspondingly. Also, when a vibration test or drop test is performed, there is no worry that the flexible flat cable 5, which is fixed by being guided through the slit 1a in the wiring board 1 to the front side and extends from the upper end face of the wiring board 1 to the rear side, will separate from the wiring board 1 as would a flexible flat cable fixed with double-sided adhesive tape. As a result, solder separation at the cable end 5a can be effectively prevented. Furthermore, the cable guide rib 4 prevents the flexible flat cable 5 from being pinched, which prevents the flexible flat cable 5 from being damaged.

Second Embodiment

Figure 3:
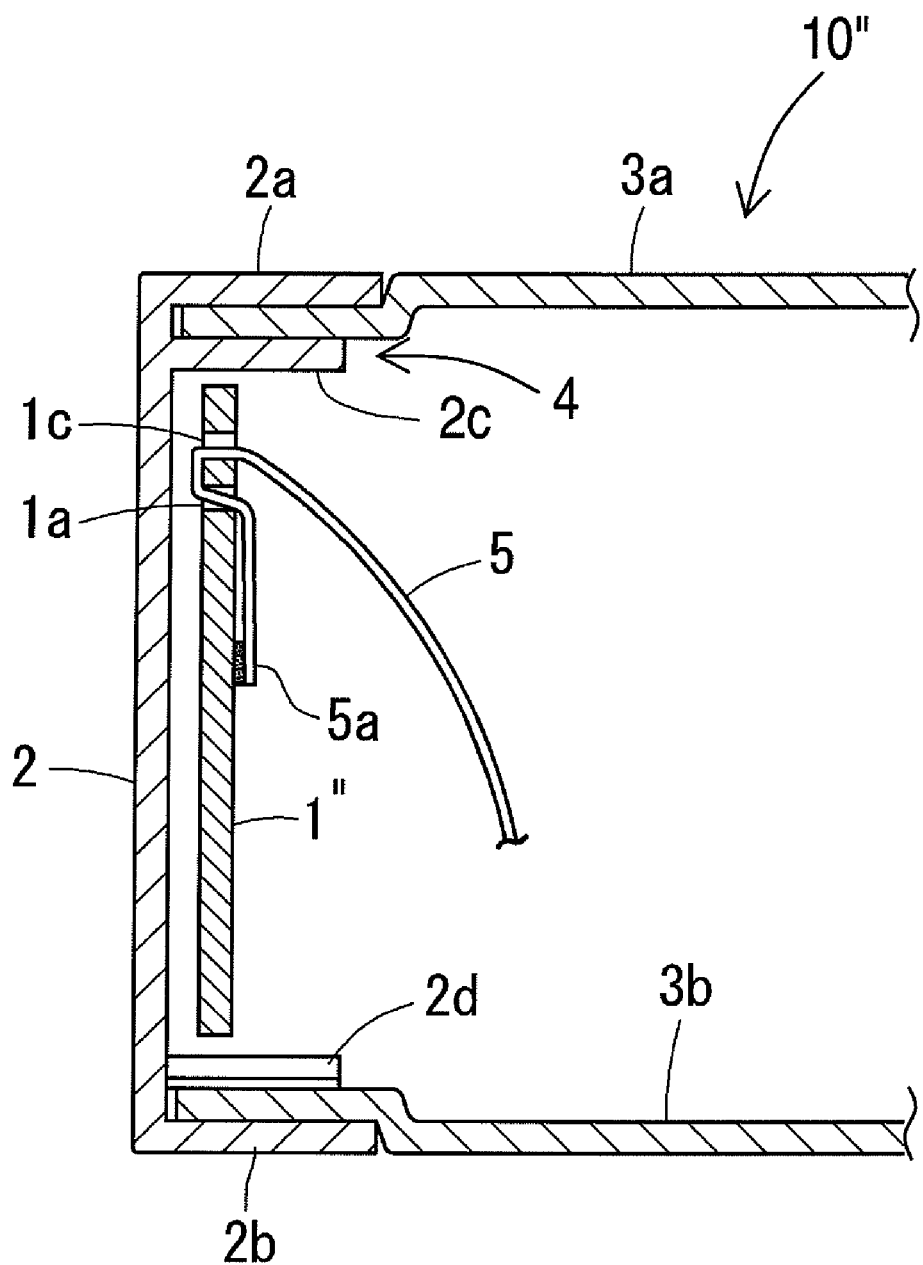
FIG. 3 is a partial cross sectional view of a cable routing structure for a flexible flat cable in accordance with a second embodiment.

Referring now to FIG. 3, a cable routing structure in accordance with a second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity. The parts of the second embodiment that differ from the parts of the first embodiment will be indicated with a double prime (").

FIG. 3 is a partial cross sectional view of the cable routing structure for the flexible flat cable 5.

With the cable routing structure, another slit (e.g., second slit) 1c is formed parallel to the slit 1a in the wiring board 1". The slit 1c is located at the same lateral position as the slit 1a. The slit 1c includes a closed hole having a continuous circumference. The wiring board 1" includes a base plate with the first and second slits 1a and 1c. The base plate is formed as a one-piece, unitary member. The flexible flat cable 5 is soldered at the cable end 5a. The flexible flat cable 5 is guided through the slit 1a to the front side of the wiring board 1". The flexible flat cable 5 further extends through the slit 1c to the rear side of the wiring board 1.

With the cable routing structure, the flexible flat cable 5 is bent and caught on the edges of the slits 1a and 1c. Therefore, it is securely fixed to the wiring board 1. Thus, even if the flexible flat cable 5 is subjected to vibration or impact, solder separation of the cable end 5a can be satisfactorily prevented.

GENERAL INTERPRETATION OF TERMS

In understanding the scope of the present invention, the term "comprising" and its derivatives, as used herein, are intended to be open ended terms that specify the presence of the stated features, elements, components and groups, but do not exclude the presence of other unstated features, elements, components and groups. The foregoing also applies to words having similar meanings such as the terms, "including", "having" and their derivatives. Also, the terms "part," "section," "portion," "member" or "element" when used in the singular can have the dual meaning of a single part or a plurality of parts. As used herein to describe the present invention, the following directional terms "forward, rearward, above, downward, vertical, horizontal, below and transverse" as well as any other similar directional terms refer to those directions of an electronic device equipped with the present invention. Accordingly, these terms, as utilized to describe the present invention should be interpreted relative to an electronic device equipped with the present invention as used in the normal operating position.

While selected embodiments have been chosen to illustrate the present invention, it will be apparent to those skilled in the art from these disclosures that various changes and modifications can be made herein without departing from the scope of the invention as defined in the appended claims. Furthermore, the foregoing descriptions of the selected embodiments according to the present invention are provided for illustration only, and not for the purpose of limiting the invention as defined by the appended claims and their equivalents.

What is claimed is:

1. A cable routing structure comprising:
 a flexible flat cable; and
 a wiring board having a first side and a second side that is opposite the first side, the wiring board including
  a cable attachment component formed on the first side of the wiring board and electrically coupled to an end portion of the flexible flat cable;
  a first access component including a first slit formed in the wiring board, with the flexible flat cable extending through the first slit from the first side of the wiring board to the second side of the wiring board; and
  a second access component disposed at a location spaced from the first access component, the flexible flat cable extending through the second access component from the second side of the wiring board to the first side of the wiring board,
 the second access component further including a side edge portion of the wiring board, the second access component being at least partially defined by a cable guide rib that protrudes from a rear face of a front panel of an electronic device adjacent the wiring board, the wiring board being fixedly attached to the front panel, and
 the flexible flat cable extending along the side edge portion from the second side of the wiring board to the first side of the wiring board, the flexible flat cable extending through a gap formed between the side edge portion of the wiring board and the cable guide rib of the front panel.

2. The cable routing structure according to claim 1, wherein
 the second access component further includes a second slit formed in the wiring board, the flexible flat cable extending through the second slit from the second side of the wiring board to the first side of the wiring board.

3. The cable routing structure according to claim 1, wherein
 the cable guide rib of the front panel is formed at a lateral position that corresponds to a lateral position of the side edge portion of the wiring board along which the flexible flat cable extends.

4. The cable routing structure according to claim 3, wherein
 the flexible flat cable is pressed against the side edge portion of the wiring board by the cable guide rib of the front panel.

5. The cable routing structure according to claim 4, wherein
 the side edge portion of the wiring board further includes a recess formed on the wiring board, and
 the flexible flat cable extends through the gap formed between the recess of the wiring board and the cable guide rib of the front panel.

6. The cable routing structure according to claim 5, wherein
the gap formed between the recess of the wiring board and the cable guide rib of the front panel has a slit-shaped cavity through which the flexible flat cable extends.

7. The cable routing structure according to claim 6, wherein
the cable guide rib of the front panel is arranged to prevent the flexible flat cable from being pinched by a cover of the electronic device that is fitted to the front panel.

8. The cable routing structure according to claim 7, wherein
the cable guide rib of the front panel is arranged to guide the cover when the cover is fitted to the front panel.

9. The cable routing structure according to claim 7, wherein
the front panel further has an edge frame portion protruding from a edge portion of the rear face of the front panel, and
the cable guide rib and the edge frame portion sandwich a distal end portion of the cover.

10. The cable routing structure according to claim 1, wherein
the wiring board includes a control-use wiring board for controlling the electronic device.

11. A cable routing structure comprising:
a flexible flat cable; and
a wiring board having a first side and a second side that is opposite the first side, the wiring board including
a cable attachment component formed on the first side of the wiring board and electrically coupled to an end portion of the flexible flat cable;
a first access component including a first slit formed in the wiring board, with the flexible flat cable extending through the first slit from the first side of the wiring board to the second side of the wiring board; and
a second access component disposed at a location spaced from the first access component, the flexible flat cable extending through the second access component from the second side of the wiring board to the first side of the wiring board,
the second access component further including a side edge portion of the wiring board, the second access component being at least partially defined by a cable guide rib that protrudes from a rear face of a front panel of an electronic device adjacent the wiring board, the wiring board being fixedly attached to the front panel, and
the flexible flat cable extending along the side edge portion from the second side of the wiring board to the first side of the wiring board, the flexible flat cable extending through a gap formed between the side edge portion of the wiring board and the cable guide rib of the front panel, the end portion of the flexible flat cable is soldered to the cable attachment component.

12. The cable routing structure according to claim 11, wherein
the cable guide rib of the front panel is formed at a lateral position that corresponds to a lateral position of the side edge portion of the wiring board along which the flexible flat cable extends.

13. The cable routing structure according to claim 12, wherein
the flexible flat cable is pressed against the side edge portion of the wiring board by the cable guide rib of the front panel.

14. The cable routing structure according to claim 13, wherein
the side edge portion of the wiring board further includes a recess formed on the wiring board, and
the flexible flat cable extends through the gap formed between the recess of the wiring board and the cable guide rib of the front panel.

15. The cable routing structure according to claim 14, wherein
the gap formed between the recess of the wiring board and the cable guide rib of the front panel has a slit-shaped cavity through which the flexible flat cable extends.

16. The cable routing structure according to claim 15, wherein
the cable guide rib of the front panel is arranged to prevent the flexible flat cable from being pinched by a cover of the electronic device that is fitted to the front panel.

17. The cable routing structure according to claim 16, wherein
the cable guide rib of the front panel is arranged to guide the cover when the cover is fitted to the front panel.

18. The cable routing structure according to claim 16, wherein
the front panel further has an edge frame portion protruding from a edge portion of the rear face of the front panel, and
the cable guide rib and the edge frame portion sandwich a distal end portion of the cover.

19. The cable routing structure according to claim 11, wherein
the wiring board includes a control-use wiring board for controlling the electronic device.

20. The cable routing structure according to claim 11, wherein
the second access component further includes a second slit formed in the wiring board, the flexible flat cable extending through the second slit from the second side of the wiring board to the first side of the wiring board.

* * * * *